United States Patent
Eid et al.

(10) Patent No.: US 9,147,633 B2
(45) Date of Patent: Sep. 29, 2015

(54) HEAT REMOVAL IN AN INTEGRATED CIRCUIT ASSEMBLY USING A JUMPING-DROPS VAPOR CHAMBER

(71) Applicant: INTEL CORPORATION, Santa Clara, CA (US)

(72) Inventors: Feras Eid, Chandler, AZ (US); Zhihua Li, Chandler, AZ (US); Chau V. Ho, Auburn, WA (US)

(73) Assignee: Intel Corporation, Santa Clara, CA (US)

(*) Notice: Subject to any disclaimer, the term of this patent is extended or adjusted under 35 U.S.C. 154(b) by 275 days.

(21) Appl. No.: 13/784,463

(22) Filed: Mar. 4, 2013

(65) Prior Publication Data

US 2014/0247556 A1  Sep. 4, 2014

(51) Int. Cl.
H01L 23/34      (2006.01)
H05K 7/20       (2006.01)
H01L 23/367     (2006.01)
H01L 23/42      (2006.01)
H01L 23/427     (2006.01)

(52) U.S. Cl.
CPC .......... *H01L 23/3675* (2013.01); *H01L 23/42* (2013.01); *H01L 23/427* (2013.01); *H01L 2224/16* (2013.01); *H01L 2224/73204* (2013.01); *H01L 2224/73253* (2013.01); *H01L 2924/16152* (2013.01); *H05K 7/20309* (2013.01); *H05K 7/20318* (2013.01); *Y10T 29/49002* (2015.01)

(58) Field of Classification Search
CPC ............... H05K 7/20–7/2099; H01L 23/427; H01L 23/3675; H01L 23/42

USPC ............ 361/679.46–679.54, 688–723
See application file for complete search history.

(56) References Cited

U.S. PATENT DOCUMENTS

2004/0124526 A1* 7/2004 Matayabas et al. ........... 257/712
2004/0264136 A1* 12/2004 Houle ........................... 361/704
2008/0128897 A1* 6/2008 Chao ............................. 257/713
2008/0150170 A1* 6/2008 Manepalli et al. ............ 257/795
2008/0174963 A1* 7/2008 Chang et al. .................. 361/700

(Continued)

OTHER PUBLICATIONS

Boreyko et al. "Self-propelled jumping drops on superhydrophobic surfaces", American Institute of Physics, Physics of Fluids, 2010.

(Continued)

*Primary Examiner* — Zachary M Pape
(74) *Attorney, Agent, or Firm* — Schwabe, Williamson & Wyatt, P.C.

(57) ABSTRACT

Embodiments of the present disclosure are directed towards techniques and configurations for thermal management of an integrated circuit assembly using a jumping-drops vapor chamber. In one embodiment, an apparatus includes a die having a first side including a plurality of integrated circuit devices that are configured to generate heat when in operation, and a second side disposed opposite to the first side, and a vapor chamber including a liquid, an evaporator including a surface that is thermally coupled with the second side of the die, the evaporator being configured to evaporate the liquid to vapor, and a condenser including a superhydrophobic surface and configured to condense the vapor, wherein energy released from coalescence of condensed vapor on the superhydrophobic surface causes the condensed vapor to jump from the superhydrophobic surface of the condenser to the surface of the evaporator. Other embodiments may be described and/or claimed.

14 Claims, 5 Drawing Sheets

(56) References Cited

U.S. PATENT DOCUMENTS

| | | | |
|---|---|---|---|
| 2010/0252237 A1* | 10/2010 | Hashimoto et al. | 165/104.21 |
| 2012/0012804 A1* | 1/2012 | Chen et al. | 257/2 |
| 2013/0244001 A1* | 9/2013 | Wang et al. | 428/141 |
| 2013/0251942 A1* | 9/2013 | Azimi et al. | 428/141 |
| 2014/0238646 A1* | 8/2014 | Enright | 165/104.21 |

OTHER PUBLICATIONS

Boreyko et al. "Self-Propelled Dropwise Condensate on Superhydrophobic Surfaces", The American Physical Society, Oct. 30, 2009; pp. 184501-1 to 184501-4.

* cited by examiner

HEAT REMOVAL IN AN INTEGRATED CIRCUIT ASSEMBLY USING A JUMPING-DROPS VAPOR CHAMBER

FIELD

Embodiments of the present disclosure generally relate to the field of integrated circuits, and more particularly, to techniques and configurations for heat removal in an integrated circuit assembly using a jumping-drops vapor chamber.

BACKGROUND

An integrated circuit (IC) device such as, for example, a die may be mounted on a package substrate to form an IC package assembly. A heat spreading element composed solely or primarily of a metal such as, for example, an integrated heat spreader and/or heat sink may be thermally coupled with the die to remove heat generated by the die when the die is in operation. For example, the heat may be generally conducted away from the die along a thermal pathway through the metal. Even when such heat spreading elements are composed of metals with high thermal conductivity such as, for example, copper, an in-plane temperature gradient may exist across the heat spreading element and reduce overall heat transfer effectiveness. For example, the gradient may result in a higher junction temperature ($T_j$) of the die or may require additional cooling power (e.g., higher fan power) to reduce the junction temperature.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

DETAILED DESCRIPTION

Figure 1:
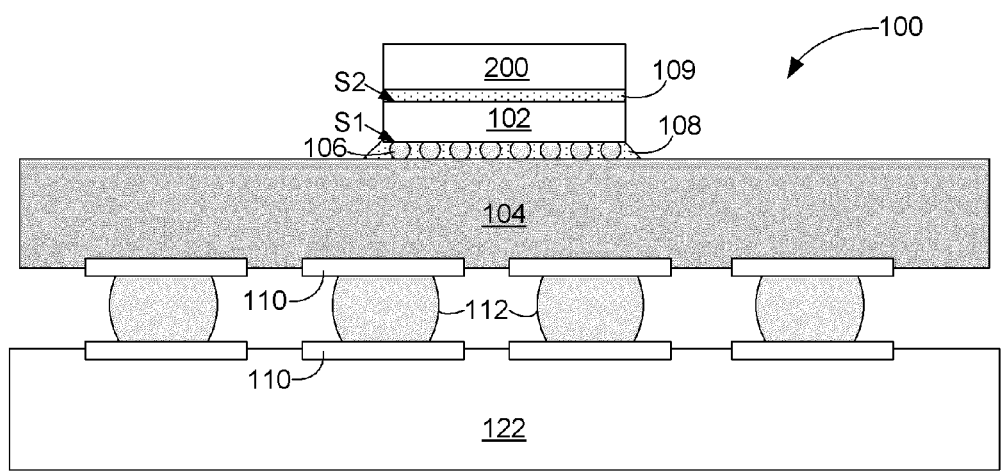
FIG. 1 schematically illustrates a cross-section side view of an example integrated circuit (IC) package assembly configured to use a jumping-drops vapor chamber for heat removal, in accordance with some embodiments.

Embodiments of the present disclosure describe techniques and configurations for heat removal (e.g., thermal management) in an integrated circuit assembly using a jumping-drops vapor chamber. In the following description, various aspects of the illustrative implementations will be described using terms commonly employed by those skilled in the art to convey the substance of their work to others skilled in the art. However, it will be apparent to those skilled in the art that embodiments of the present disclosure may be practiced with only some of the described aspects. For purposes of explanation, specific numbers, materials and configurations are set forth in order to provide a thorough understanding of the illustrative implementations. However, it will be apparent to one skilled in the art that embodiments of the present disclosure may be practiced without the specific details. In other instances, well-known features are omitted or simplified in order not to obscure the illustrative implementations.

In the following detailed description, reference is made to the accompanying drawings which form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The description may use perspective-based descriptions such as top/bottom, in/out, over/under, and the like. Such descriptions are merely used to facilitate the discussion and are not intended to restrict the application of embodiments described herein to any particular orientation.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or more elements are in direct contact.

In various embodiments, the phrase "a first feature formed, deposited, or otherwise disposed on a second feature," may mean that the first feature is formed, deposited, or disposed over the second feature, and at least a part of the first feature may be in direct contact (e.g., direct physical and/or electrical contact) or indirect contact (e.g., having one or more other features between the first feature and the second feature) with at least a part of the second feature.

As used herein, the term "module" may refer to, be part of, or include an Application Specific Integrated Circuit (ASIC), an electronic circuit, a processor (shared, dedicated, or group) and/or memory (shared, dedicated, or group) that execute one or more software or firmware programs, a combinational logic circuit, and/or other suitable components that provide the described functionality.

FIG. 1 schematically illustrates a cross-section side view of an example integrated circuit (IC) package assembly 100 configured to use a jumping-drops vapor chamber 200 for heat removal, in accordance with some embodiments. In some embodiments, the IC package assembly 100 may include a die 102 thermally coupled with the jumping-drops vapor chamber 200, as can be seen. The IC package assembly 100 may further include a package substrate 104 electrically coupled with the die 102, as can be seen. The package substrate 104 may further be electrically coupled with a circuit board 122, as can be seen. The IC package assembly 100 may include other suitable configurations in other embodiments.

The jumping-drops vapor chamber (hereinafter "vapor chamber 200") may include an evaporator configured to evaporate a liquid in a chamber area and a condenser to condense the vapor to liquid. A surface of the condenser may be hydrophobic in nature such that energy released from coalescence of condensed vapor on the hydrophobic surface causes the condensed vapor to spontaneously jump from the hydrophobic surface of the condenser to a surface of the evaporator. The vapor chamber 200 is further described in connection with FIG. 2.

The die 102 may be thermally coupled with the vapor chamber 200 using, for example, a thermal interface material (TIM) 109. The TIM 109 may be composed of thermally conductive materials such as, for example, thermally conductive epoxy, grease, elastomer, solder paste, composite materials, phase change materials, carbon graphite, thin foils or other suitable materials. The TIM 109 may be formed, for example, by depositing a thermally conductive material on an outer surface of the die 102 or vapor chamber 200 and, in some embodiments, may be heated or cured to form a bond that provides a thermal pathway between the die 102 and the vapor chamber 200. Other suitable techniques to thermally couple the die 102 and the vapor chamber 200 may be used in other embodiments.

The die 102 can be attached to the package substrate 104 according to a variety of suitable configurations including, a flip-chip configuration, as depicted, or other configurations such as, for example, being embedded in the package substrate 104 or being configured in a wirebonding arrangement. In the flip-chip configuration, an active side (e.g., side S1) of the die 102 is attached to a surface of the package substrate 104 using die interconnect structures 106 such as bumps, pillars, or other suitable structures that may also electrically couple the die 102 with the package substrate 104. The active side of the die 102 may include a plurality of integrated circuit (IC) devices such as, for example, transistor devices that are configured to generate heat when in operation.

The vapor chamber 200 may be thermally coupled with an inactive side (e.g., side S2) of the die 102 that is disposed opposite to the active side of the die 102, as can be seen. The vapor chamber 200 is configured to remove heat generated by the plurality of IC devices on the active side of the die 102 when in operation.

The die 102 may represent a discrete chip made from a semiconductor material and may be, include, or be a part of a processor, memory, or ASIC in some embodiments. In some embodiments, an electrically insulative material such as, for example, molding compound or underfill material 108 may partially encapsulate a portion of the die 102 and/or interconnect structures 106.

The die interconnect structures 106 may be configured to route electrical signals between the die 102 and the package substrate 104. In some embodiments, the electrical signals may include, for example, input/output (I/O) signals and/or power or ground signals associated with the operation of the die 102.

The package substrate 104 may include electrical routing features configured to route electrical signals to or from the die 102. The electrical routing features may include, for example, traces (not shown) disposed on one or more surfaces of the package substrate 104 and/or internal routing features such as, for example, trenches, vias or other interconnect structures (not shown) to route electrical signals through the package substrate 104. For example, in some embodiments, the package substrate 104 may include electrical routing features such as die bond pads (not shown) configured to receive the die interconnect structures 106 and route electrical signals between the die 102 and the package substrate 104.

In some embodiments, the package substrate 104 is an epoxy-based laminate substrate having a core and/or build-up layers such as, for example, an Ajinomoto Build-up Film (ABF) substrate. The package substrate 104 may include other suitable types of substrates in other embodiments including, for example, substrates formed from glass, ceramic, or semiconductor materials.

The circuit board 122 may be a printed circuit board (PCB) composed of an electrically insulative material such as an epoxy laminate. For example, the circuit board 122 may include electrically insulating layers composed of materials such as, for example, polytetrafluoroethylene, phenolic cotton paper materials such as Flame Retardant 4 (FR-4), FR-1, cotton paper and epoxy materials such as CEM-1 or CEM-3, or woven glass materials that are laminated together using an epoxy resin prepreg material. Structures (not shown) such as traces, trenches, vias may be formed through the electrically insulating layers to route the electrical signals of the die 102 through the circuit board 122. The circuit board 122 may be composed of other suitable materials in other embodiments. In some embodiments, the circuit board 122 is a motherboard (e.g., motherboard 802 of FIG. 8).

Package level interconnects such as, for example, solder balls 112 may be coupled to one or more pads (hereinafter "pads 110") on the package substrate 104 and/or on the circuit board 122 to form corresponding solder joints that are configured to further route the electrical signals to between the package substrate 104 and the circuit board 122. The pads 110 may be composed of any suitable electrically conductive material such as metal including, for example, nickel (Ni), palladium (Pd), gold (Au), silver (Ag), copper (Cu), and combinations thereof. Other suitable techniques to physically and/or electrically couple the package substrate 104 with the circuit board 122 may be used in other embodiments.

Figure 2:
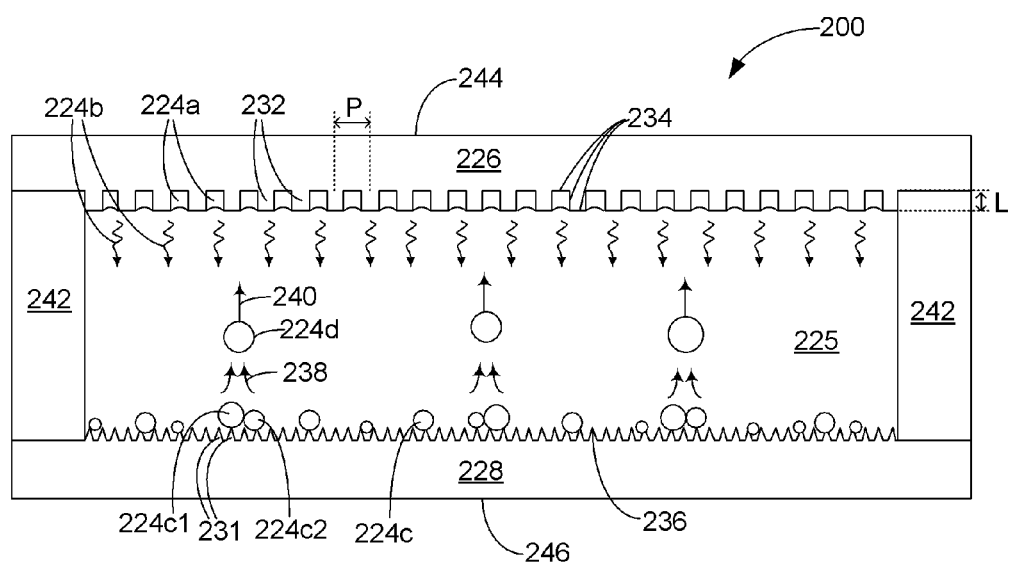
FIG. 2 schematically illustrates a cross-section side view of an example jumping-drops vapor chamber.

FIG. 2 schematically illustrates a cross-section side view of an example jumping-drops vapor chamber 200. In some embodiments, the vapor chamber 200 may include a liquid (e.g., liquid 224a) that is enclosed in a chamber area 225. The chamber area 225 may be vacuumed, partially filled with a working fluid (e.g., liquid 224a) and sealed to provide a pressure in the vapor chamber 200 that is at least lower than ambient pressure and may be as low as allowed by present and/or emerging technologies. In some embodiments, the pressure may be near or below a vapor pressure of the working fluid. According to various embodiments, the liquid 224a may be configured to change phase from liquid 224a to vapor with small change in temperature, with the temperature being in a range from 0° C. to 100° C. In one embodiment, the liquid 224a is water which can change phase at as little as <1° C. at sufficiently low pressure. In other embodiments, other suitable liquids and/or boiling point ranges may be used such as, for example, water at different boiling temperature and pressure, ethanol, acetone and/or other types of alcohols.

The vapor chamber 200 may include an evaporator 226 configured to evaporate the liquid 224a to vapor phase (e.g., vapor represented by arrows 224b, hereinafter "vapor 224b") and a condenser 228 configured to condense the vapor 224b. When in operation, heat generated by an electronic device (e.g., IC devices of die 102 of FIG. 1) may cause liquid 224a on a surface 234 of the evaporator 226 to evaporate. The surface 236 of the condenser 228 may be hydrophobic in nature (e.g., superhydrophobic) such that when the vapor 224b cools and condenses on the surface 236 of the condenser 228, adjacent droplets (e.g., droplet 224c1 and droplet 224c2) of condensed vapor 224c may coalesce (e.g., as indicated by arrows 238) and surface energy released from coalescence may cause the condensed vapor 224c to jump (e.g., jumping drop 224d formed from coalesced droplets 224c1 and 224c2 jumping in example direction of arrow 240) from the surface 236 of the condenser 228 to the evaporator 226.

In some embodiments, the surface 236 may be superhydrophobic (e.g., contact angle greater than 150°). In some embodiments, the surface 236 may be superhydrophobic with a contact angle in the range of 150°-180°. In some embodiments, the surface 236 may be surface-treated, coated, and/or patterned to produce a superhydrophobic surface. For example, in one embodiment, the surface 236 may be composed of silicon that is processed to contain surface asperities or patterned structures and/or hydrophobicized by surface functionalization (e.g., using silane or polymer coatings). In one embodiment, the surface 236 may be composed of black silicon. The surface 236 may include surfaces of hierarchical structures 231 configured to provide a superhydrophobic surface in some embodiments. The surface 236 may be composed of other suitable materials to increase hydrophobicity in other embodiments.

The evaporator 226 may include one or more wick structures (hereinafter "wick structures 232") that are configured to capture and hold the liquid 224a between adjacent wick structures of the wick structures 232, as can be seen. In some embodiments, the wick structures 232 may have a pitch, P, between adjacent wick structures and a length, L, as can be seen. While other vapor chambers may rely on capillary action of wick structures for return of condensed vapor to the evaporator, the vapor chamber 200, on the other hand, may rely on the jumping-drops action of the condensed vapor 224c for return of the condensed vapor 224c to the evaporator. Thus, the pitch P and the length L may be respectively finer and shorter for the wick structures 232 than a pitch and length of traditional wick structures used for capillary return. In some embodiments, the pitch P may be less than 40 microns (um), such as a nominal value of 20 um, and the length may be less than 100 um, such as a nominal value of 50 um. Other suitable values for pitch P and length L may be used in other embodiments.

A finer pitch P and/or shorter length L may provide a variety of benefits. For example, a longer length L may increase thermal resistance and reduce an overall conductivity of the vapor chamber 200. Thus, providing a shorter length L may reduce thermal resistance in the vapor chamber 200. In some embodiments, a thermal conductivity of about 2500 watts/meter·K (W/m·K) may be achieved in all three directions (e.g., x, y, z directions corresponding with three intersecting orthogonal planes). The thermal conductivity of the vapor chamber 200 may be lower or higher according to various embodiments. The finer pitch P may allow a higher heat flux before boiling incipiency. Other vapor chambers with coarser pitch wicks may suffer from low dry-out fluxes.

The vapor chamber 200 is configured to dynamically mitigate for localized hot spots across the vapor chamber. In hot spot areas, the evaporation rate will be higher than other areas leading to a faster cooling rate in the hot spot areas, thus providing dynamic temperature uniformity control without requiring any special design for the hot spot areas. The vapor chamber 200 may reduce junction temperature in an IC package assembly, resulting in increased performance of IC devices and lower power requirements for cooling.

The surface 234 of the evaporator 226 may be surface-treated, coated, and/or patterned to be hydrophilic or wetting (e.g., contact angle less than 30°) and may include surfaces of the wick structures 232 in various embodiments. In some embodiments, the surface 234 of the evaporator 226 may be superhydrophilic. Making the surface 234 hydrophilic in nature may facilitate capture and holding by the surface 234 of the jumping drops (e.g., jumping drop 224d) that jump from the condenser 228 to the evaporator 226. For example, in some embodiments, the surface 234 may include sintered copper or patterned silicon with an oxidized surface.

The evaporator 226 and/or the condenser 228 may be in the form of a plate or analogous structure that is composed of a thermally conductive material such as, for example, a metal (e.g., copper) or a semiconductor material (e.g., silicon), or suitable combination thereof. Other suitable metals, semiconductor materials and/or other suitable materials may be used to form the evaporator 226 and/or condenser 228 in other embodiments.

Walls 242 of the vapor chamber 200 may be configured to structurally couple the evaporator 226 and the condenser 228. In some embodiments, the walls 242 may be composed of a material with much lower thermal conductivity relative to material of the evaporator 226 and the condenser 228. For example, in some embodiments, the walls 242 may be composed of a polymer such as rubber that is configured to seal pressure of the chamber area 225. The walls 242 may be composed of other suitable materials including thermally conductive materials in other embodiments.

Referring to both FIGS. 1 and 2, in some embodiments, an outer surface 244 of the vapor chamber 200 that is adjacent to the evaporator 226 is coupled with the second side S2 of the die 102 using the TIM 109. In some embodiments, the evaporator 226 is disposed between the condenser 228 and the die 102. According to various embodiments, the condenser 228 may be positioned relative to the evaporator 226 such that the condensed vapor 224c on the surface 236 is configured to jump from the surface 236 of the condenser 228 to the surface 234 of the evaporator 226 in a direction against the force of gravity. In other embodiments, the condenser 228 and the evaporator 226 may be positioned relative to one another such that the condensed vapor 224c is configured to jump from the surface 236 to the surface 234 in a direction with the force of gravity. In yet other embodiments, the condenser 228 and the evaporator 226 may be positioned relative to one another such that the condensed vapor 224c is configured to jump from the surface 236 to the surface 234 in a direction perpendicular to or at some non-zero angle with respect to the force of gravity.

Modeling and some experiments have shown that different orientations exhibit little differences in performance.

Figure 3:
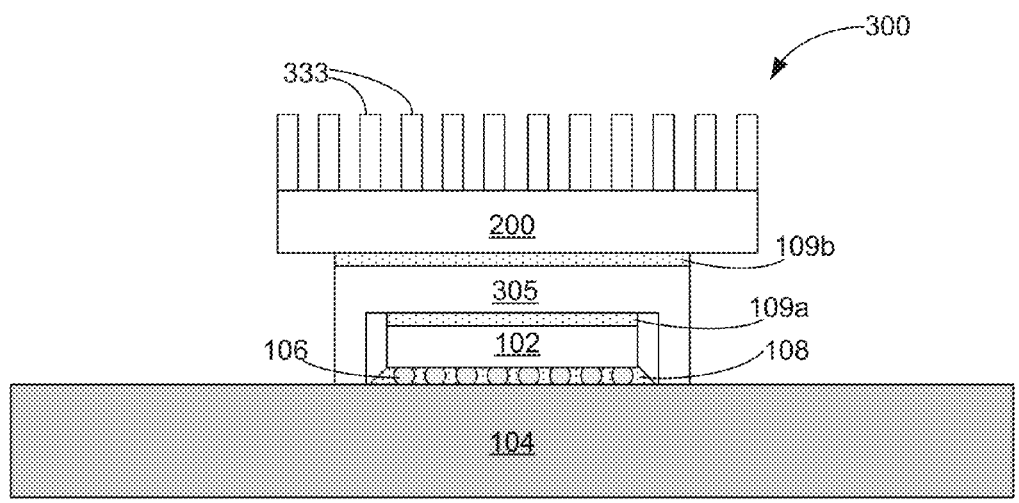
FIG. 3 schematically illustrates a cross-section side view of an example configuration of an integrated circuit (IC) package assembly that is configured to use a jumping-drops vapor chamber for heat removal, in accordance with some embodiments.

FIG. 3 schematically illustrates a cross-section side view of an example configuration of an integrated circuit (IC) package assembly 300 that is configured to use a jumping-drops vapor chamber (e.g., vapor chamber 200 of FIG. 2) for heat removal, in accordance with some embodiments. In an embodiment, the IC package assembly 300 may include a die 102 mounted on a package substrate 104 in a flip-chip configuration, an integrated heat spreader (IHS) 305 thermally coupled with the inactive side of the die 102 using a first TIM 109a and a vapor chamber 200 thermally coupled with the IHS 305 using a second TIM 109b, as can be seen. Materials of the first TIM 109a and/or second TIM 109b may include materials described in connection with TIM 109 of FIG. 1.

The IHS 305 may be primarily composed of a thermally conductive material such as, for example, a metal (e.g., copper). The IHS 305 may include other thermally conductive materials in other embodiments. In some embodiments, the IHS 305 may further be coupled with the package substrate 104. For example, legs of the IHS 305 may be coupled with the package substrate 104 using an adhesive such as solder or epoxy. The IHS 305 may be coupled with the package substrate 104 using other suitable techniques in other embodiments.

The vapor chamber 200 may comport with embodiments described in connection with FIG. 2. Fins 333 may be thermally coupled with the vapor chamber 200 by welding, soldering or other suitable technique to further facilitate heat removal away from the die 102. The fins 333 may be composed of metal or another thermally conductive material. In some embodiments, an evaporator-side (e.g., outer surface 244 of FIG. 2) of the vapor chamber 200 is coupled with the IHS 305 using the second TIM 109b and the fins 333 are formed on a condenser-side (e.g., outer surface 246 of the vapor chamber 200 adjacent to the condenser 228 of FIG. 2).

Figure 4:
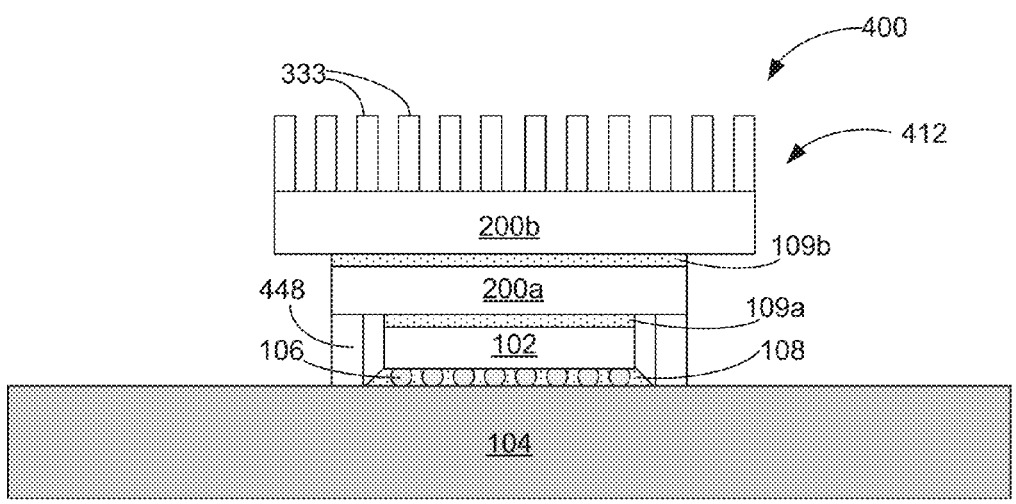
FIG. 4 schematically illustrates a cross-section side view of an example configuration of an integrated circuit (IC) package assembly that is configured to use multiple jumping-drops vapor chambers for heat removal, in accordance with some embodiments.

FIG. 4 schematically illustrates a cross-section side view of an example configuration of an integrated circuit (IC) package assembly 400 that is configured to use multiple jumping-drops vapor chambers (e.g., vapor chamber 200a and vapor chamber 200b included in a heat sink 412) for heat removal, in accordance with some embodiments. The IC package assembly 400 may comport with embodiments described in connection with FIG. 3 except that the IHS 305 has been replaced with a vapor chamber 200a, as can be seen. The vapor chambers 200a and 200b may comport with embodiments described in connection with vapor chamber 200 of FIG. 2.

An evaporator-side of the vapor chamber 200a may be coupled with an inactive side of the die 102 using a first TIM 109a and a condenser-side of the vapor chamber 200a may be coupled with the vapor chamber 200b using a second TIM 109b. In some embodiments, legs 448 may be used to couple the vapor chamber 200a with the package substrate 104, as can be seen, to provide additional structural stability. The legs 448 may be composed of any suitable material to provide structural support.

In other embodiments, the IC package assembly 400 may be modified to provide a configuration where only the vapor chamber 200a is used and the vapor chamber 200b is replaced with a base plate of a heat sink. For example, the vapor chamber 200b may be replaced with a metal base plate that is thermally coupled with the vapor chamber 200a using the second TIM 109b and the fins 333 may be coupled with the metal base plate.

Figure 5:
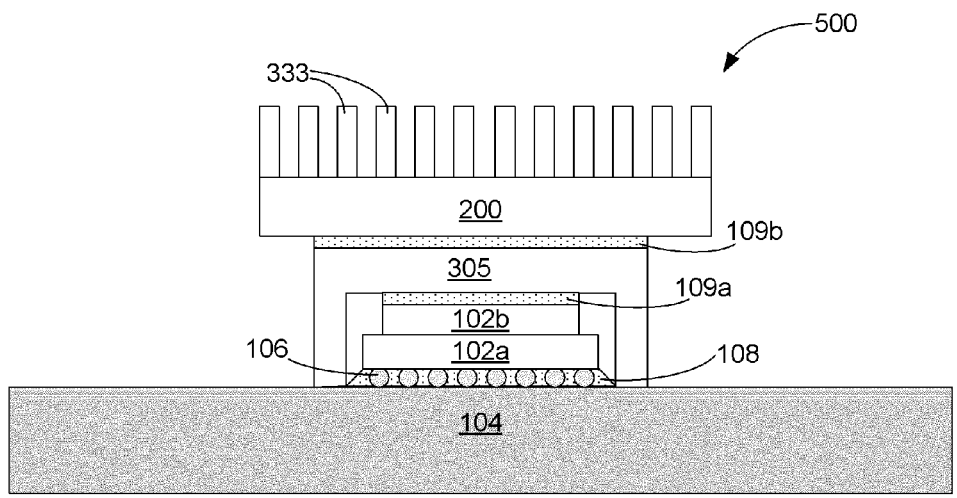
FIG. 5 schematically illustrates a cross-section side view of another example configuration of an integrated circuit (IC) package assembly that is configured to use a jumping-drops vapor chamber for heat removal, in accordance with some embodiments.

FIG. 5 schematically illustrates a cross-section side view of another example configuration of an integrated circuit (IC) package assembly 500 that is configured to use a jumping-drops vapor chamber (e.g., vapor chamber 200) for heat removal, in accordance with some embodiments. The IC package assembly 500 may comport with embodiments described in connection with the IC package assembly 300 of FIG. 3 except that the die 102 of FIG. 3 is replaced with dies 102a, 102b in a stacked configuration in FIG. 5. In some embodiments multiple dies (e.g., dies 102a, 102b) may be coupled together in a stacked arrangement. For example, the die 102b may be memory and the die 102a may be a processor. The die 102b may be electrically coupled with the die 102a using a through-silicon via (TSV) technique or other suitable technique. The dies 102a, 102b may serve other functions than processor and memory and may be coupled together using other suitable techniques according to various embodiments.

Figure 6:
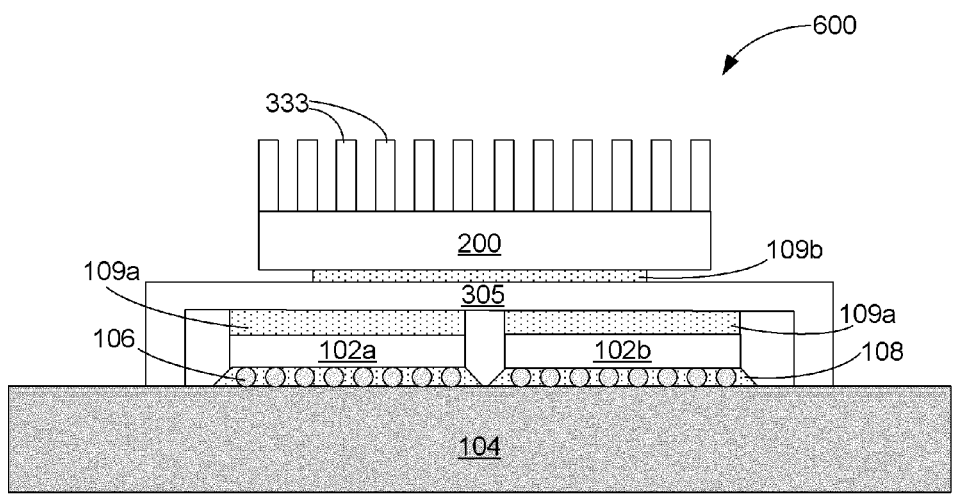
FIG. 6 schematically illustrates a cross-section side view of yet another example configuration of an integrated circuit (IC) package assembly that is configured to use a jumping-drops vapor chamber for heat removal, in accordance with some embodiments.

FIG. 6 schematically illustrates a cross-section side view of yet another example configuration of an integrated circuit (IC) package assembly 600 that is configured to use a jumping-drops vapor chamber (e.g., vapor chamber 200) for heat removal, in accordance with some embodiments. The IC package assembly 600 may comport with embodiments described in connection with the IC package assembly 300 of FIG. 3 except that the die 102 in FIG. 3 is replaced with dies 102a, 102b in a side-by-side configuration in FIG. 6. Each of the dies 102a, 102b is thermally coupled with the IHS 305 using a first TIM 109a. The IHS 305 is thermally coupled with the vapor chamber 200 using the second TIM 109b.

Embodiments described in connection with IC package assemblies 100, 300, 400, 500 and 600 of respective FIGS. 1, 3, 4, 5 and 6 may be suitably combined according to various embodiments. For example, in some embodiments, the IHS 305 of FIGS. 5 and 6 may be replaced with a vapor chamber 200 according to embodiments described in connection with FIG. 4. In other embodiments, the vapor chamber 200 of FIGS. 5 and 6 may be replaced with a base plate of a heat sink as described in connection with FIG. 4. In some embodiments, multiple dies may be mounted in a stacked and/or a side-by-side configuration in accordance with combinations of embodiments described in connection with FIGS. 5 and 6, and so forth.

Figure 7:
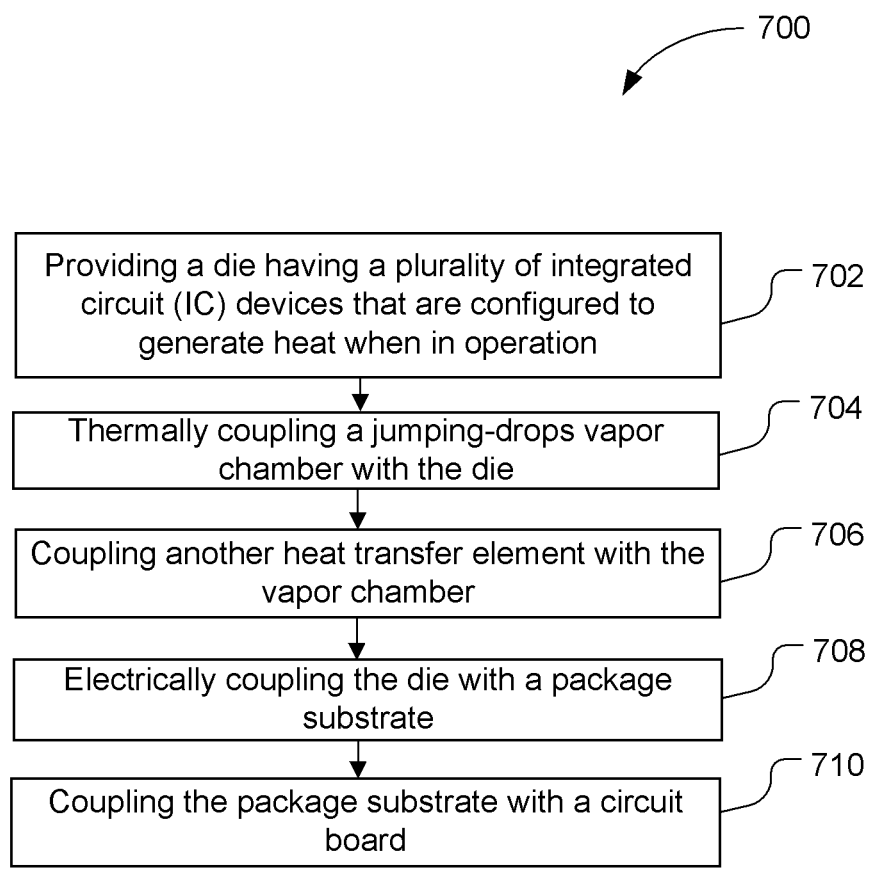
FIG. 7 schematically illustrates a flow diagram for a method of fabricating an IC package assembly that is configured to use a jumping-drops vapor chamber for heat removal, in accordance with some embodiments.

FIG. 7 schematically illustrates a flow diagram for a method 700 of fabricating an IC package assembly (e.g., IC package assembly 100 of FIG. 1) that is configured to use a jumping-drops vapor chamber (e.g., vapor chamber 200 of FIG. 2) for heat removal, in accordance with some embodiments. The method 700 may comport with techniques described in connection with FIGS. 1-6 according to various embodiments.

At 702, the method 700 may include providing a die (e.g., die 102 of FIG. 1) having a plurality of integrated circuit (IC) devices that are configured to generate heat when in operation. The IC devices may include, for example, transistors formed on an active side (e.g., side S1 of die 102 of FIG. 1) of the die.

At 704, the method 700 may further include thermally coupling a jumping-drops vapor chamber (e.g., vapor chamber 200 of FIG. 2) with the die. In some embodiments, the jumping-drops vapor chamber may be thermally coupled with an inactive side (e.g., side S2 of die 102 of FIG. 1) of the die using a thermal interface material (e.g., TIM 109 of FIG. 1). For example, an outer surface (e.g., outer surface 244 of FIG. 2) of the jumping-drops vapor chamber adjacent to the evaporator may be coupled with the inactive side of the die using the TIM.

In other embodiments, thermally coupling a jumping-drops vapor chamber with the die may be performed by forming and/or coupling one or more heat transfer elements (e.g., first TIM 109a, IHS 305, and second TIM 109b of FIG. 3) between the die and the jumping-drops vapor chamber to provide a thermal pathway to the jumping drops vapor chamber. In one embodiment, thermally coupling the jumping-drops vapor chamber with the die may include coupling an outer surface of the vapor chamber adjacent to the evaporator with an IHS using a second TIM. For example, the IHS 305 may be thermally coupled with the die by depositing a first TIM (e.g., first TIM 109a of FIG. 3), placing an IHS (e.g., IHS 305 of FIG. 3) on the first TIM, depositing a second TIM (e.g., second TIM 109b of FIG. 3) on the IHS, placing the jumping-drops vapor chamber on the second TIM, and reflowing or curing or otherwise thermally processing the TIM to form a thermal bond between the die and the IHS and between the IHS and the jumping-drops vapor chamber. A separate reflow process may be used for each of the first TIM and the second TIM in some embodiments.

At 706, the method 700 may further include coupling another heat transfer element with the jumping-drops vapor chamber. For example, in embodiments where a surface of the jumping-drops vapor chamber is coupled with the die using TIM 109 as depicted in FIG. 1, a heat sink composed of a metal plate (e.g., copper) may be coupled with a condenser-side (e.g., outer surface 246 of FIG. 2) of the jumping-drops vapor chamber using another TIM (e.g., second TIM 109b of FIG. 4) as further described in connection with an embodiment of FIG. 4.

In embodiments where the jumping-drops vapor chamber (e.g., vapor chamber 200 of FIG. 3) is configured as depicted in FIG. 3, coupling another heat transfer element with the jumping-drops vapor chamber may include coupling an IHS (e.g., IHS 305 of FIG. 3) or another jumping-drops vapor chamber (e.g., vapor chamber 200a of FIG. 4) with the inactive side of the die using a first TIM (e.g., first TIM 109a of FIG. 3 or 4) and coupling the jumping-drops vapor chamber with the IHS or other jumping-drops vapor chamber using a second TIM (e.g., second TIM 109b of FIG. 3 or 4).

At 708, the method 700 may further include electrically coupling the first side of the die with a package substrate (e.g., package substrate 104 of FIG. 1, 3, 4, 5 or 6). In some embodiments, the die may be electrically coupled with the package substrate using die interconnect structures 106 in a flip-chip configuration. In other embodiments, the die (e.g., die 102b of FIG. 5) may be electrically coupled with the package substrate through another die (e.g., die 102a of FIG. 5) that is electrically coupled with the package substrate. In other embodiments, the die may be one of multiple dies coupled with the package substrate in a stacked and/or side-by-side configuration as depicted in connection with FIGS. 5 and 6. Dies of the multiple dies may also be thermally coupled with the jumping-drops vapor chamber according to techniques described herein.

At 710, the method 700 may further include coupling the package substrate with a circuit board (e.g., circuit board 122 of FIG. 1). The package substrate may be coupled with the circuit board by forming, package level interconnect such as, for example, solder balls (e.g., solder balls 112 of FIG. 1) using a reflow process. Other suitable techniques to couple the package substrate and the circuit board may be used in other embodiments.

Various operations are described as multiple discrete operations in turn, in a manner that is most helpful in understanding the claimed subject matter. However, the order of description should not be construed as to imply that these operations are necessarily order dependent. For example, in some embodiments, actions at 708 can be performed prior to actions at 704. Other actions of the method 700 may be performed in another suitable order than depicted.

Figure 8:
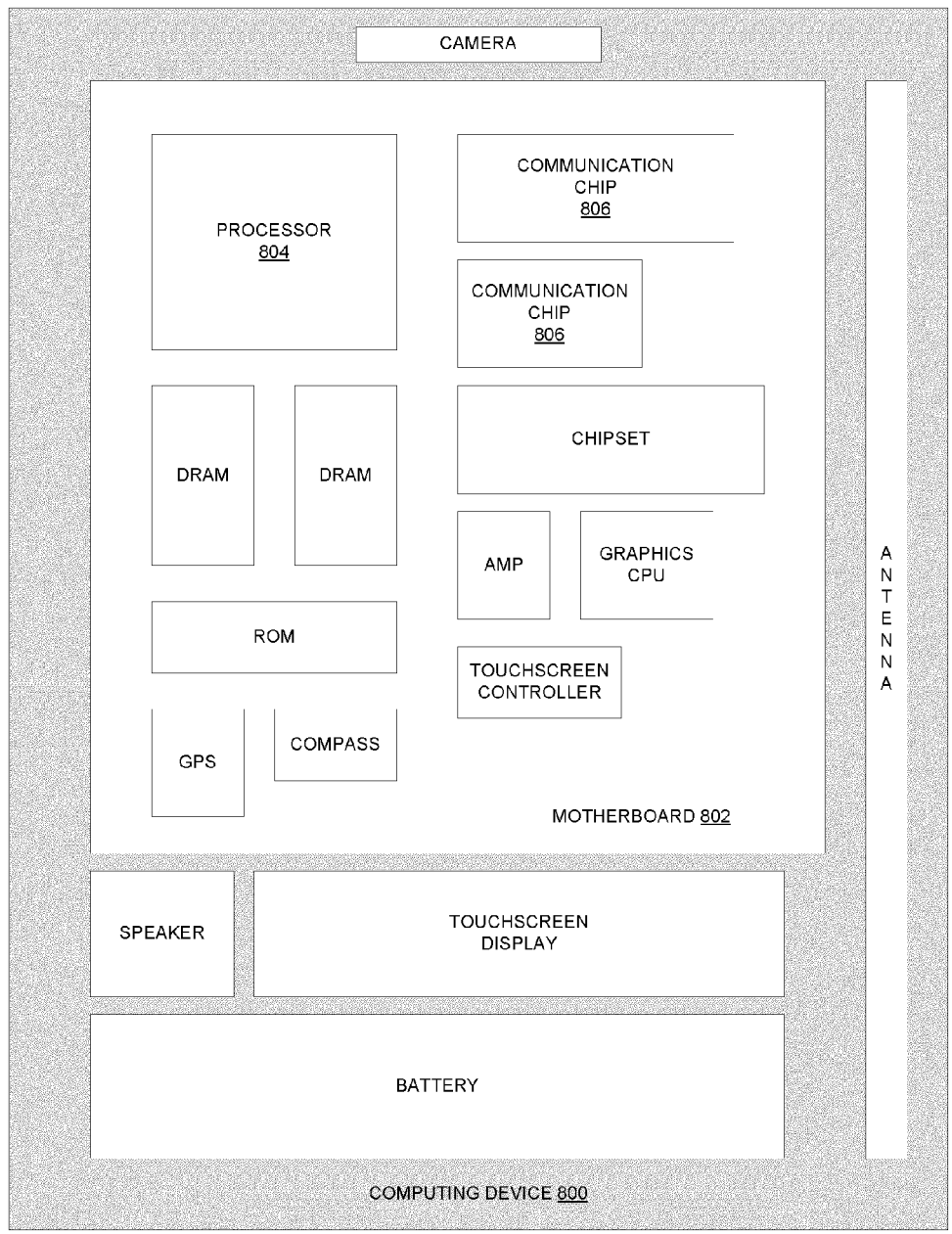
FIG. 8 schematically illustrates a computing device that includes an IC package assembly that is configured to use a jumping-drops vapor chamber for heat removal, in accordance with some embodiments.

Embodiments of the present disclosure may be implemented into a system using any suitable hardware and/or software to configure as desired. FIG. 8 schematically illustrates a computing device that includes an IC package assembly that is configured to use a jumping-drops vapor chamber for heat removal, in accordance with some embodiments. The computing device 800 may house a board such as motherboard 802. The motherboard 802 may include a number of components, including but not limited to a processor 804 and at least one communication chip 806. The processor 804 may be physically and electrically coupled to the motherboard 802. In some implementations, the at least one communication chip 806 may also be physically and electrically coupled to the motherboard 802. In further implementations, the communication chip 806 may be part of the processor 804.

Depending on its applications, computing device 800 may include other components that may or may not be physically and electrically coupled to the motherboard 802. These other components may include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, a Geiger counter, an accelerometer, a gyroscope, a speaker, a camera, and a mass storage device (such as hard disk drive, compact disk (CD), digital versatile disk (DVD), and so forth).

The communication chip 806 may enable wireless communications for the transfer of data to and from the computing device 800. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 806 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible BWA networks are generally referred to as WiMAX networks, an acronym that stands for Worldwide Interoperability for Microwave Access, which is a certification mark for products that pass conformity and interoperability tests for the IEEE 802.16 standards. The communication chip 806 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 806 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 806 may operate in accordance with Code Division Multiple Access (CDMA), Time Division Multiple Access (TDMA), Digital Enhanced Cordless Telecommunications (DECT), Evolution-Data Optimized (EV-DO), derivatives thereof, as well as any other wireless protocols that are designated as 3G, 4G, 5G, and beyond. The communication chip 806 may operate in accordance with other wireless protocols in other embodiments.

The computing device 800 may include a plurality of communication chips 806. For instance, a first communication chip 806 may be dedicated to shorter range wireless communications such as Wi-Fi and Bluetooth and a second communication chip 806 may be dedicated to longer range wireless communications such as GPS, EDGE, GPRS, CDMA, WiMAX, LTE, Ev-DO, and others.

The processor 804 of the computing device 800 may include a die (e.g., die 102 of FIG. 1) thermally coupled with a jumping-drops vapor chamber (e.g., vapor chamber 200 of FIG. 2) in an IC package assembly (e.g., IC package assemblies 100, 300, 400, 500 or 600 of respective FIG. 1, 3, 4, 5 or 6) as described herein. For example, the circuit board 122 of FIG. 1 may be a motherboard 802 and the processor 804 may be a die 102 mounted on a package substrate 104 of FIG. 1. The package substrate 104 and the motherboard 802 may be coupled together using package level interconnects. The term "processor" may refer to any device or portion of a device that processes electronic data from registers and/or memory to transform that electronic data into other electronic data that may be stored in registers and/or memory.

The communication chip 806 may also include a die (e.g., die 102 of FIG. 1) thermally coupled with a jumping-drops vapor chamber (e.g., vapor chamber 200 of FIG. 2) in an IC package assembly (e.g., IC package assemblies 100, 300, 400, 500 or 600 of respective FIG. 1, 3, 4, 5 or 6) as described herein. In further implementations, another component (e.g., memory device or other integrated circuit device) housed within the computing device 800 may include a die (e.g., die 102 of FIG. 1) thermally coupled with a jumping-drops vapor chamber (e.g., vapor chamber 200 of FIG. 2) in an IC package assembly (e.g., IC package assemblies 100, 300, 400, 500 or 600 of respective FIG. 1, 3, 4, 5 or 6) as described herein.

In various implementations, the computing device 800 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 800 may be any other electronic device that processes data.

According to various embodiments, the present disclosure describes an apparatus including a jumping-drops vapor chamber for thermal management of one or more dies. In some embodiments, the apparatus comprises a die having a first side including a plurality of integrated circuit devices that are configured to generate heat when in operation, and a second side disposed opposite to the first side, and a vapor chamber including a liquid, an evaporator including a surface that is thermally coupled with the second side of the die, the evaporator being configured to evaporate the liquid to vapor, and a condenser including a superhydrophobic surface and configured to condense the vapor, wherein energy released from coalescence of condensed vapor on the superhydrophobic surface causes the condensed vapor to jump from the superhydrophobic surface of the condenser to the surface of the evaporator.

In some embodiments, an outer surface of the vapor chamber adjacent to the evaporator is coupled with the second side of the die using a thermal interface material (TIM). In some embodiments, the TIM is a first TIM, and the apparatus further comprises a heat sink. An outer surface of the vapor chamber adjacent to the condenser may be coupled with the heat sink using a second TIM.

In some embodiments, the die includes a processor or memory composed of a semiconductor material, the plurality of integrated circuit devices includes transistors, the liquid is configured to change phase from liquid to vapor at a temperature in a range from 0° C. to 100° C., the first TIM and the second TIM include one or more of thermally conductive epoxy, grease, elastomer, solder paste, composite, phase change materials, carbon graphite, or thin foils, and/or the heat sink includes a copper plate having fins protruding from a surface of the copper plate in a direction away from the die. In some embodiments, the vapor chamber is a first jumping-drops vapor chamber and the heat sink includes a second jumping-drops vapor chamber. In some embodiments, the apparatus includes an integrated heat spreader coupled with the second side of the die using a first thermal interface material (TIM), wherein the integrated heat spreader is primarily composed of a metal and wherein an outer surface of the vapor chamber adjacent to the evaporator is coupled with the integrated heat spreader using a second thermal interface material (TIM).

In some embodiments, the apparatus further includes a package substrate, wherein the first side of the die is electrically coupled with the package substrate. The liquid may be one or more of water, ethanol, acetone or an alcohol. In some embodiments, the die is one of multiple dies mounted in a stacked or side-by-side arrangement on the package substrate and the vapor chamber is configured to remove heat generated by the multiple dies when in operation.

In some embodiments, the surface of the evaporator is hydrophilic and includes wick structures. The wick structures may be composed of one or more of sintered copper or oxidized silicon. The superhydrophobic surface of the condenser may be composed of silicon that is configured with surface asperities, hierarchal structures or surface functionalization. In some embodiments, the vapor chamber is sealed to provide a pressure in the vapor chamber that is lower than ambient pressure and the condensed vapor on the superhydrophobic surface is configured to jump from the superhydrophobic surface of the condenser to the surface of the evaporator in any direction including a direction against the force of gravity when the die is in operation.

According to various embodiments, the present disclosure describes a method of fabricating an apparatus (e.g., an IC package assembly) that is configured to use a jumping-drops vapor chamber for heat removal. In some embodiments, the method comprises providing a die, the die having a first side including a plurality of integrated circuit devices that are configured to generate heat when in operation, and a second side disposed opposite to the first side and thermally coupling a vapor chamber with the second side of the die, the vapor chamber including a liquid, an evaporator including a surface thermally coupled with the second side of the die, the evaporator being configured to evaporate the liquid to vapor, and a condenser including a superhydrophobic surface and configured to condense the vapor, wherein energy released from coalescence of condensed vapor on the superhydrophobic surface causes the condensed vapor to jump from the superhydrophobic surface of the condenser to the surface of the evaporator.

In some embodiment, thermally coupling the vapor chamber with the second side of the die comprises coupling an outer surface of the vapor chamber adjacent to the evaporator with the second side of the die using a thermal interface material (TIM). In some embodiments, the TIM is a first TIM and the method may further comprise coupling a heat sink with the vapor chamber, wherein an outer surface of the vapor chamber adjacent to the condenser is coupled with the heat sink using a second TIM.

In some embodiments, the method may further include coupling an integrated heat spreader with the second side of the die using a first thermal interface material (TIM). The integrated heat spreader may be primarily composed of a metal. In some embodiments, thermally coupling the vapor chamber with the second side of the die comprises coupling an outer surface of the vapor chamber adjacent to the evaporator with the integrated heat spreader using a second thermal interface material (TIM).

In some embodiments, the method may further include electrically coupling the first side of the die with a package substrate. The method may include coupling multiple dies including the die with the package substrate in a stacked or side-by-side arrangement. The method may include thermally coupling the multiple dies with the vapor chamber, wherein the vapor chamber is configured to remove heat generated by the multiple dies when in operation. The method may further include coupling the package substrate with a circuit board.

According to various embodiments, the present disclosure describes a system including a jumping-drops vapor chamber for thermal management of one or more dies. In some embodiments, the system comprises a circuit board, a die electrically coupled with the circuit board, the die having a first side including a plurality of integrated circuit devices that are configured to generate heat when in operation, and a second side disposed opposite to the first side and a vapor chamber including a liquid, an evaporator including a surface thermally coupled with the second side of the die, the evaporator being configured to evaporate the liquid to vapor, and a condenser including a superhydrophobic surface and configured to condense the vapor, wherein energy released from coalescence of condensed vapor on the superhydrophobic surface causes the condensed vapor to jump from the superhydrophobic surface of the condenser to the surface of the evaporator.

The system may further include an integrated heat spreader coupled with the second side of the die using a first thermal interface material (TIM), wherein the integrated heat spreader is primarily composed of a metal and wherein an outer surface of the vapor chamber adjacent to the evaporator is coupled with the integrated heat spreader using a second thermal interface material (TIM). The system may further include a package substrate coupled with the die, wherein the first side of the die is electrically coupled with the circuit board through the package substrate.

In some embodiments, the die is one of multiple dies mounted in a stacked or side-by-side arrangement on the package substrate and the vapor chamber is configured to remove heat generated by the multiple dies when in operation. The system may further include one or more of an antenna, a display, a touchscreen display, a touchscreen controller, a battery, an audio codec, a video codec, a power amplifier, a global positioning system (GPS) device, a compass, a Geiger counter, an accelerometer, a gyroscope, a speaker, or a camera coupled with the circuit board. The system may be one of a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder.

The above description of illustrated implementations, including what is described in the Abstract, is not intended to be exhaustive or to limit the embodiments of the present disclosure to the precise forms disclosed. While specific implementations and examples are described herein for illustrative purposes, various equivalent modifications are possible within the scope of the present disclosure, as those skilled in the relevant art will recognize.

These modifications may be made to embodiments of the present disclosure in light of the above detailed description. The terms used in the following claims should not be construed to limit various embodiments of the present disclosure to the specific implementations disclosed in the specification and the claims. Rather, the scope is to be determined entirely by the following claims, which are to be construed in accordance with established doctrines of claim interpretation.

What is claimed is:

1. An apparatus comprising:
a die having
 a first side including a plurality of integrated circuit devices that are configured to generate heat when in operation, and
 a second side disposed opposite to the first side;
a first jumping drops vapor chamber including
 a liquid,
 an evaporator including a surface that is thermally coupled with the second side of the die by having an outer surface of the first jumping drops vapor chamber adjacent to the evaporator coupled with the second side of the die using a first thermal interface material (TIM), the evaporator being configured to evaporate the liquid to vapor, and
 a condenser including a superhydrophobic surface and configured to condense the vapor, wherein energy released from coalescence of condensed vapor on the superhydrophobic surface causes the condensed vapor to jump from the superhydrophobic surface of the condenser to the surface of the evaporator; and
a heat sink, wherein an outer surface of the first jumping drops vapor chamber adjacent to the condenser is coupled with the heat sink using a second TIM and the heat sink includes a second jumping-drops vapor chamber.

2. The apparatus of claim 1, wherein:
the die includes a processor or memory composed of a semiconductor material;
the plurality of integrated circuit devices includes transistors;
the liquid is configured to change phase from liquid to vapor at a temperature in a range from 0° C. to 100° C.;
the first TIM and the second TIM include one or more of thermally conductive epoxy, grease, elastomer, solder paste, composite, phase change materials, carbon graphite, or thin foils; and
the heat sink includes fins protruding in a direction away from the die.

3. The apparatus of claim 1, further comprising:
a package substrate, wherein the first side of the die is electrically coupled with the package substrate and wherein the liquid is one or more of water, ethanol, acetone or an alcohol.

4. The apparatus of claim 3, wherein:
the die is one of multiple dies mounted in a stacked or side-by-side arrangement on the package substrate; and
the first jumping drops vapor chamber is configured to remove heat generated by the multiple dies when in operation.

5. The apparatus of claim 1, wherein:
the surface of the evaporator is hydrophilic and includes wick structures;
the wick structures are composed of one or more of sintered copper or oxidized silicon; and
the superhydrophobic surface of the condenser is composed of silicon that is configured with surface asperities, hierarchal structures or surface functionalization.

6. The apparatus of claim 1, wherein:
the first jumping drops vapor chamber is sealed to provide a pressure in the vapor chamber that is lower than ambient pressure; and
the condensed vapor on the superhydrophobic surface is configured to jump from the superhydrophobic surface of the condenser to the surface of the evaporator in any direction including a direction against the force of gravity when the die is in operation.

7. A method comprising:
providing a die, the die having
a first side including a plurality of integrated circuit devices that are configured to generate heat when in operation, and
a second side disposed opposite to the first side;
thermally coupling a first jumping drops vapor chamber with the second side of the die, the vapor chamber including
a liquid;
an evaporator configured to evaporate the liquid to vapor, and wherein an outer surface of the first jumping drops vapor chamber adjacent to the evaporator is coupled with the second side of the die using a first thermal interface material (TIM), and
a condenser including a superhydrophobic surface and configured to condense the vapor, wherein energy released from coalescence of condensed vapor on the superhydrophobic surface causes the condensed vapor to jump from the superhydrophobic surface of the condenser to the surface of the evaporator; and
providing a heat sink, wherein an outer surface of the first jumping drops vapor chamber adjacent to the condenser is coupled with the heat sink using a second TIM and the heat sink includes a second jumping-drops vapor chamber.

8. The method of claim 7, further comprising:
electrically coupling the first side of the die with a package substrate.

9. The method of claim 8, further comprising:
coupling multiple dies, including the die with the package substrate, in a stacked or side-by-side arrangement; and
thermally coupling the multiple dies with the first jumping drops vapor chamber, wherein the first jumping drops vapor chamber is configured to remove heat generated by the multiple dies when in operation.

10. The method of claim 8, further comprising:
coupling the package substrate with a circuit board.

11. A system comprising:
a circuit board;
a die electrically coupled with the circuit board, the die having
a first side including a plurality of integrated circuit devices that are configured to generate heat when in operation, and
a second side disposed opposite to the first side; and
a first jumping drops vapor chamber including
a liquid,
an evaporator including a surface thermally coupled with the second side of the die by having an outer surface of the first jumping drops vapor chamber adjacent to the evaporator coupled with the second side of the die using a first thermal interface material (TIM), the evaporator being configured to evaporate the liquid to vapor,
a condenser including a superhydrophobic surface and configured to condense the vapor, wherein energy released from coalescence of condensed vapor on the superhydrophobic surface causes the condensed vapor to jump from the superhydrophobic surface of the condenser to the surface of the evaporator, and
a heat sink, wherein an outer surface of the first jumping drops vapor chamber adjacent to the condenser is coupled with the heat sink using a second TIM and the heat sink includes a second jumping-drops vapor chamber.

12. The system of claim 11, further comprising:
a package substrate coupled with the die, wherein the first side of the die is electrically coupled with the circuit board through the package substrate.

13. The system of claim 12, wherein:
the die is one of multiple dies mounted in a stacked or side-by-side arrangement on the package substrate; and
the first jumping drops vapor chamber is configured to remove heat generated by the multiple dies when in operation.

14. The system of claim 11, further comprising:
one or more of an antenna, a display, a touchscreen display, a touchscreen controller, a battery, an audio codec, a video codec, a power amplifier, a global positioning system (GPS) device, a compass, a Geiger counter, an accelerometer, a gyroscope, a speaker, or a camera coupled with the circuit board, wherein the system is one of a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder.

* * * * *